United States Patent
Mizuno et al.

(10) Patent No.: US 9,547,252 B2
(45) Date of Patent: Jan. 17, 2017

(54) ORGANIC LIGHT EMITTING DEVICE

(71) Applicant: CANON KABUSHIKI KAISHA, Tokyo (JP)

(72) Inventors: Nobutaka Mizuno, Tokyo (JP); Kiyofumi Sakaguchi, Miura-gun (JP); Satoru Shiobara, Funabashi (JP); Yojiro Matsuda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/734,425

(22) Filed: Jun. 9, 2015

(65) Prior Publication Data

US 2015/0362855 A1 Dec. 17, 2015

(30) Foreign Application Priority Data

Jun. 17, 2014 (JP) ................................. 2014-124482

(51) Int. Cl.
*G03G 15/04* (2006.01)
*H01L 51/52* (2006.01)
*H05B 33/08* (2006.01)
*H01L 51/50* (2006.01)

(52) U.S. Cl.
CPC ........... *G03G 15/04* (2013.01); *H01L 51/5012* (2013.01); *H01L 51/5225* (2013.01); *H01L 51/5253* (2013.01); *H05B 33/0896* (2013.01)

(58) Field of Classification Search
CPC . G03G 15/04; H01L 51/5209; H01L 51/5225; H01L 51/524
See application file for complete search history.

(56) References Cited

U.S. PATENT DOCUMENTS

| 5,953,585 A | 9/1999 | Miyaguchi |
| 7,531,847 B2 | 5/2009 | Shitagaki et al. |
| 7,714,506 B2 * | 5/2010 | Matsudate .......... H01L 27/3223 313/506 |

(Continued)

FOREIGN PATENT DOCUMENTS

| CN | 1728900 A | 2/2006 |
| KR | 10-2011-0060302 A | 6/2011 |

(Continued)

OTHER PUBLICATIONS

Pending U.S. Appl. No. 14/734,567, filed Jun. 9, 2015 (not yet published).

(Continued)

*Primary Examiner* — Ricardo L Osorio
(74) *Attorney, Agent, or Firm* — Fitzpatrick, Cella, Harper & Scinto

(57) ABSTRACT

Provided is an organic light emitting device, including: a lower electrode; an upper electrode and a substrate having an electrode pad portion, in which when an angle formed by a slant in section of a film end in a region between the lower electrode and the electrode pad portion and a surface of the substrate is given as $\theta_1$, Formula (1) and Formula (2) are satisfied; and when an angle formed by a slant in section of a film end in at least a part of other regions than the region between the lower electrode and the electrode pad portion and the surface of the substrate is given as $\theta_3$, Formula (3) and Formula (4) are satisfied.

$$\tan(\theta_1) = d_1/d_2 \quad (1)$$

$$\tan(\theta_1) < 0.2 \quad (2)$$

$$\tan(\theta_3) = d_3/d_4 \quad (3)$$

$$\tan(\theta_3) \geq 0.2 \quad (4)$$

12 Claims, 8 Drawing Sheets

(56) References Cited

U.S. PATENT DOCUMENTS

| | | | |
|---|---|---|---|
| 7,772,018 B2 * | 8/2010 | Yi | H01L 51/524 257/E21.024 |
| 7,936,432 B2 * | 5/2011 | Kim | G02F 1/13458 349/149 |
| 8,217,396 B2 | 7/2012 | Yamazaki et al. | |
| 8,445,915 B2 * | 5/2013 | You | H01L 27/3248 257/449 |
| 8,459,840 B2 * | 6/2013 | Ishimori | C04B 35/44 362/293 |
| 8,624,249 B2 * | 1/2014 | Lee | H01L 27/3248 257/59 |
| 8,643,019 B2 * | 2/2014 | Moon | H01L 27/3276 257/59 |
| 8,785,964 B2 | 7/2014 | Shitagaki et al. | |
| 8,796,768 B2 * | 8/2014 | You | H01L 29/4908 257/347 |
| 8,823,009 B2 | 9/2014 | Yamazaki et al. | |
| 8,829,527 B2 | 9/2014 | Yamazaki et al. | |
| 8,957,437 B2 | 2/2015 | Koh et al. | |
| 9,306,177 B2 | 4/2016 | Sakuma et al. | |
| 9,392,657 B2 * | 7/2016 | Lee | H05B 33/0842 |
| 2004/0245541 A1 | 12/2004 | Shitagaki et al. | |
| 2006/0043510 A1 | 3/2006 | Yamazaki et al. | |
| 2009/0218939 A1 | 9/2009 | Shitagaki et al. | |
| 2011/0175123 A1 | 7/2011 | Koh et al. | |
| 2012/0248470 A1 | 10/2012 | Yamazaki et al. | |
| 2013/0001571 A1 | 1/2013 | Yamazaki et al. | |
| 2014/0332819 A1 | 11/2014 | Yamazaki et al. | |
| 2015/0076461 A1 | 3/2015 | Shitagaki et al. | |
| 2015/0194613 A1 | 7/2015 | Sakuma et al. | |

FOREIGN PATENT DOCUMENTS

| | | |
|---|---|---|
| KR | 102011-0084771 A | 7/2011 |
| WO | 2004/060021 A1 | 7/2004 |
| WO | 2013/190982 A1 | 12/2013 |

OTHER PUBLICATIONS

Chinese Office Action issued for counterpart application No. 2015103206123 dated Nov. 4, 2016- 10 pages including English translation.

* cited by examiner

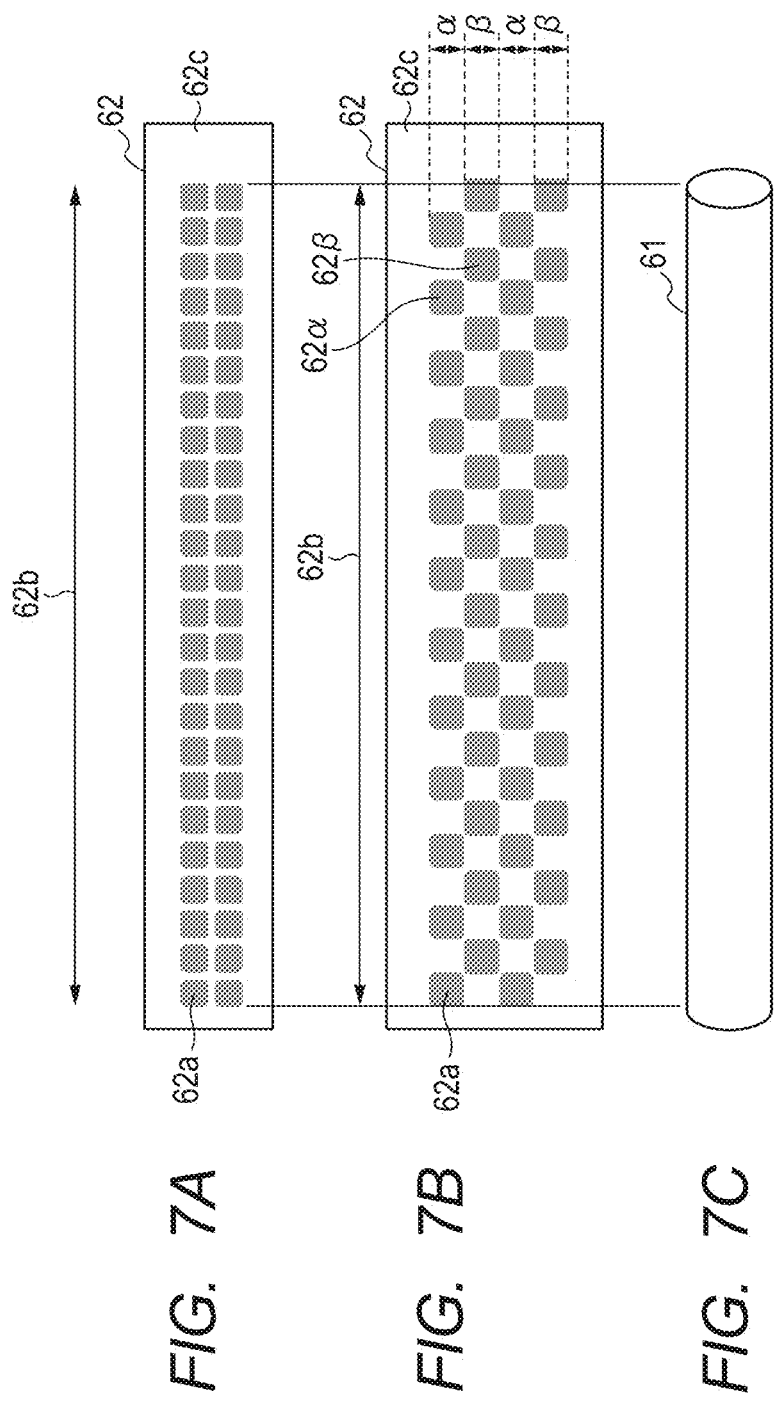

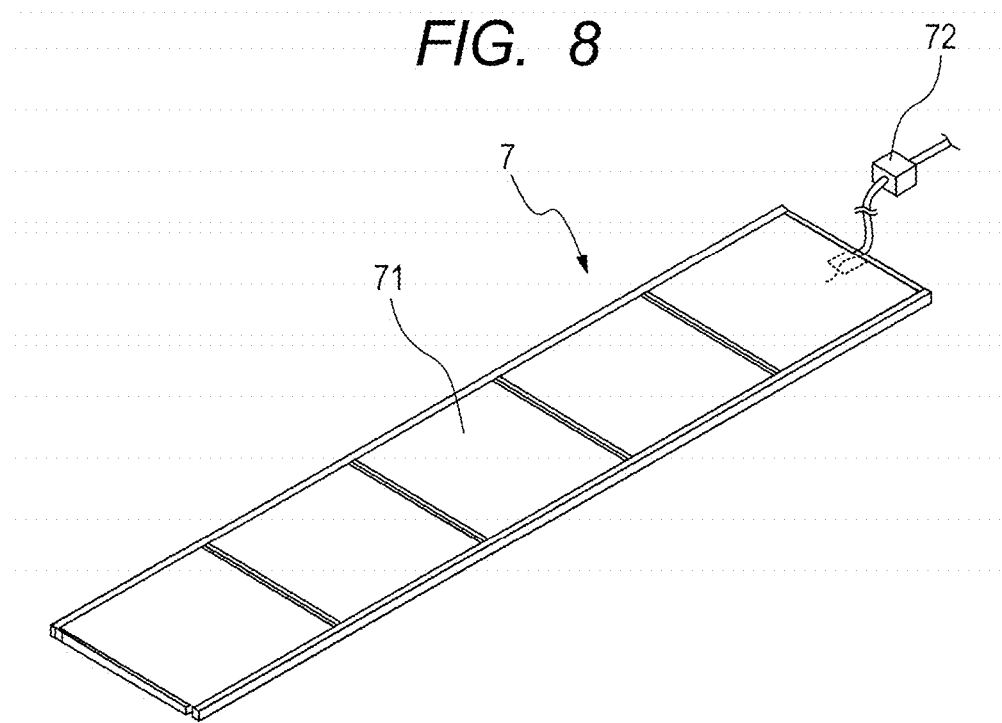

ORGANIC LIGHT EMITTING DEVICE

BACKGROUND OF THE INVENTION

1. Field of the Invention

The present invention relates to an organic light emitting device.

2. Description of the Related Art

Organic light emitting devices are devices in which a plurality of organic light emitting elements are arranged in lines or in a matrix on a base material or a substrate. Organic light emitting devices can be used for multicolor display when organic light emitting elements are arranged so that one pixel (a set of sub-pixels) is formed from a combination of organic light emitting elements each emitting light of a different color, for example, a combination of one red-light emitting element, one green-light emitting element, and one blue-light emitting element.

Organic light emitting elements that form an organic light emitting device each include a pair of electrodes and an organic emission layer interposed between the pair of electrodes. The color of light emitted by an organic light emitting element varies depending on what material is selected as a light emitting material contained in the organic emission layer.

Vacuum vapor deposition using a metal mask is widely employed as a method of forming an organic compound layer and an upper electrode, which is formed on the organic compound layer. However, vacuum vapor deposition using a metal mask is low in the precision of the alignment of the metal mask with a substrate where a film is formed, and in the precision of film forming for reasons including the thermal expansion of the metal mask, and is accordingly unsuitable for the manufacture of a high-definition display device. In addition, portions of the organic compound layer and other films that are formed in regions at the edges of the metal mask decrease gently in thickness from around a set film thickness to 0, which means that the regions are non-effective regions and a waste in layout.

A method of selectively forming, with high precision, an organic compound layer by photolithography without using a high-definition metal mask is described in U.S. Pat. No. 5,953,585. Specifically, the method includes forming an organic compound layer, an upper electrode layer, and a protective layer on the entire substrate, and subsequently patterning the organic compound layer, the upper electrode layer, and the protective layer at once into a desired shape. The described method also includes performing separate patterning on the combination of "the organic compound layer, the upper electrode layer, and the protective layer" in regions that corresponds to three colors, R, G, and B, as needed.

However, ends of a film that is patterned by the method of U.S. Pat. No. 5,953,585, namely, photolithography, to be turned into the organic compound layer are exposed to the external environment. With the ends of the film to be turned into the organic compound layer exposed to the external environment, the very organic compound layer, which does not have gas barrier properties, deteriorates due to water and oxygen seeping from the exposed ends. Another problem of U.S. Pat. No. 5,953,585, which includes patterning the organic compound layer and the upper electrode layer but does not disclose how to form connection between an upper electrode and a feeding pad portion formed on the substrate side, is a possibility of failure to establish electrical connection to organic light emitting elements that form a device.

SUMMARY OF THE INVENTION

The present invention has been made to solve the problems described above, and it is an object of the present invention to provide an organic light emitting device in which electrical connection to an upper electrode is secured and a frame region is narrow.

According to one embodiment of the present invention, there is provided an organic light emitting device, including:
  a substrate;
  a lower electrode disposed on the substrate;
  an upper electrode; and
  an organic compound layer including an emission layer, which is interposed between the lower electrode and the upper electrode,
  in which the organic compound layer covers the lower electrode,
  in which the upper electrode covers the organic compound layer,
  in which the substrate includes an electrode pad portion, which is electrically connected to wiring connected to the upper electrode,
  in which a portion of the organic compound layer that is provided in a region between the lower electrode and the electrode pad portion has a film end, and, when an angle formed by a slant in section of the film end and a surface of the substrate is given as $\theta_1$, Formula (1) and Formula (2) are satisfied, and
  in which a portion of the organic compound layer that is provided in at least a part of other regions than the region between the lower electrode and the electrode pad portion has a film end, and, when an angle formed by a slant in section of the film end and the surface of the substrate is given as $\theta_3$, Formula (3) and Formula (4) given below are satisfied.

$$\tan(\theta_1) = d_1/d_2 \tag{1}$$

$$\tan(\theta_1) < 0.2 \tag{2}$$

$$\tan(\theta_3) = d_3/d_4 \tag{3}$$

$$\tan(\theta_3) \geq 0.2 \tag{4}$$

(The symbols $d_1$ and $d_2$ in Formula (1) represent a thickness of the organic compound layer and a taper width in section of the film end of the organic compound layer, respectively, and the symbols $d_3$ and $d_4$ in Formula (3) represent a thickness of the organic compound layer and a taper width in section of the film end of the organic compound layer, respectively.)

Further features of the present invention will become apparent from the following description of exemplary embodiments with reference to the attached drawings.

BRIEF DESCRIPTION OF THE DRAWINGS

FIG. 1A is a plan view while FIG. 1B is a sectional view taken along the line 1B-1B in FIG. 1A.

Of FIGS. 7A, 7B, and 7C, FIG. 7A and FIG. 7B are schematic plan views outlining specific examples of an exposure light source (exposing device) that forms the image forming device, and FIG. 7C is a schematic view outlining a specific example of a photosensitive member that forms the image forming device.

FIG. 8 is a schematic view for illustrating an example of a lighting device that includes organic light emitting elements according to the present invention.

DESCRIPTION OF THE EMBODIMENTS

Figure 1A:
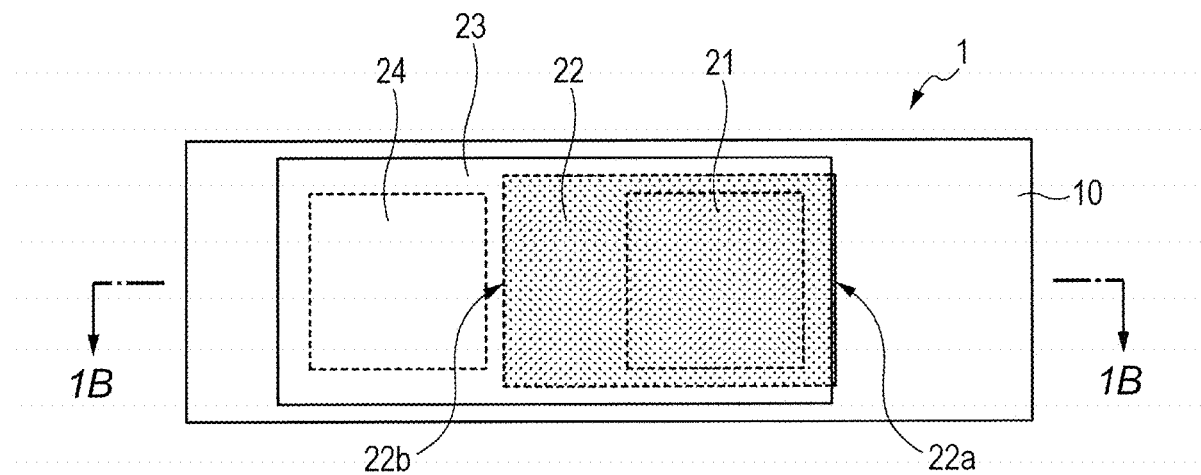
FIGS. 1A and 1B are schematic sectional views for illustrating an example of an organic light emitting device according to embodiments of the present invention.

Preferred embodiments of the present invention will now be described in detail in accordance with the accompanying drawings.

(Organic Light Emitting Device)

The present invention relates to an organic light emitting device, including: a substrate; a lower electrode disposed on the substrate; an upper electrode; and an organic compound layer including an emission layer, which is interposed between the lower electrode and the upper electrode. In the present invention, the organic compound layer covers the lower electrode, and the upper electrode covers the organic compound layer. In the present invention, the substrate includes an electrode pad portion, which is electrically connected to wiring connected to the upper electrode. The "electrode pad portion" is also referred to as "upper-electrode electrode pad portion".

In the present invention, a portion of the organic compound layer that is formed in a region between the lower electrode and the upper-electrode electrode pad portion has a film end, and, when an angle formed by a slant in section of the film end and a surface of the substrate is given as $\theta_1$, Formula (1) and Formula (2) are satisfied.

$$\tan(\theta_2)=d_1/d_2 \quad (1)$$

$$\tan(\theta_2)<0.2 \quad (2)$$

(The symbols $d_1$ and $d_2$ in Formula (1) represent a thickness of the organic compound layer and a taper width in section of the film end of the organic compound layer, respectively.)

Further, in the present invention, a portion of the organic compound layer that is formed in at least a part of other regions than the region between the lower electrode and the upper-electrode electrode pad portion has a film end, and, when an angle formed by a slant in section of the film end and the surface of the substrate is given as $\theta_3$, Formula (3) and Formula (4) are satisfied.

$$\tan(\theta_3)=d_3/d_4 \quad (3)$$

$$\tan(\theta_3)\geq 0.2 \quad (4)$$

(The symbols $d_3$ and $d_4$ in Formula (3) represent a thickness of the organic compound layer and a taper width in section of the film end of the organic compound layer, respectively.)

Details of Formula (1) to Formula (4) are described later.

Embodiments of the present invention are described in detail below with reference to the accompanying drawings. However, the present invention is not limited to the embodiments described below. Well-known technologies in the technical field of the present invention can be applied to parts that have no particular description in the following description and no particular illustration in the drawings.

Figure 1B:
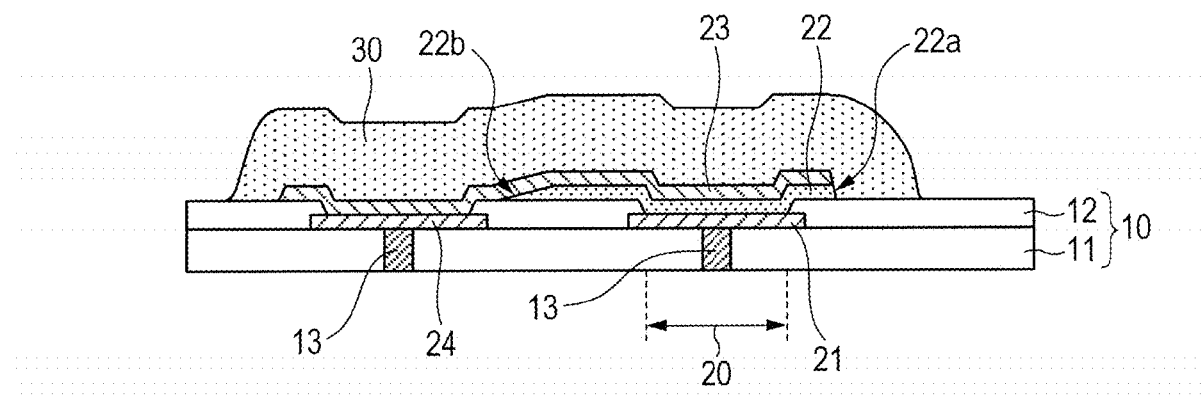

FIGS. 1A and 1B are schematic sectional views for illustrating an example of an organic light emitting device according to the embodiments of the present invention. FIG. 1A is a plan view and FIG. 1B is a sectional view taken along the line 1B-1B in FIG. 1A. The organic light emitting device of FIGS. 1A and 1B is denoted by 1, and includes a substrate 10, which includes an interlayer insulating layer 11 and a pixel isolating film 12, and an organic light emitting element disposed on the substrate 10 in a region corresponding to a light emitting pixel 20. The organic light emitting element includes a lower electrode 21, an organic compound layer 22, and an upper electrode 23.

Though not shown in FIGS. 1A and 1B, the substrate 10 of the organic light emitting device 1 has a base substrate under the interlayer insulating layer 11. Drive circuits and wiring for driving the organic light emitting element may be arranged between the interlayer insulating layer 11 and the base substrate in the present invention. In the case where the drive circuits and the wiring are arranged between the interlayer insulating layer 11 and the base substrate, contact holes 13 are formed in a given region (for example, regions where the lower electrode 21 and an upper-electrode electrode pad portion 24 are formed) of the interlayer insulating layer 11. The contact holes 13 are filled with a conductive material for electrically connecting the electrodes that are formed above the interlayer insulating layer 11 (the electrode 21 and the electrode pad portion 24) to the drive circuits and the wiring.

In the organic light emitting device 1 of FIGS. 1A and 1B, in the pixel isolating film 12, which forms the substrate 10, openings are formed in regions where the lower electrode 21 and the upper-electrode electrode pad portion 24 are to be formed. The opening in the region of the pixel isolating film 12 where the lower electrode 21 is to be formed is a region to serve as the light emitting pixel 20. The pixel isolating film 12 is therefore a member that defines an emission region (an emission region defining member). In the present invention, the shape in plan view of the emission region 20 can be defined by other methods than providing the pixel isolating film 12 above the lower electrode 21 through patterning in a given shape, and may be defined by patterning the lower electrode 21 in advance through photolithography or other methods. The emission region is an opening region of the pixel isolating film 12 in the case where the pixel isolating film 12 is formed, and is a region in the lower electrode 21 in the case where the pixel isolating film 12 is not formed. In short, "emission region" refers to a portion of the lower electrode 21 that is covered with the organic compound layer 22 instead of the pixel isolating film 12.

In the organic light emitting device 1 of FIGS. 1A and 1B, the lower electrode 21, which forms the organic light emitting element, is an electrode formed on the interlayer insulating layer 11, which forms the substrate 10, and the ends of the lower electrode 21 are covered with the pixel isolating film 12.

In the organic light emitting device 1 of FIGS. 1A and 1B, the organic compound layer 22, which forms the organic light emitting element, is a member formed selectively in the emission region 20 and a region surrounding the emission region 20. The organic compound layer 22 in the present invention is formed through patterning with the use of a given photomask. The specific method of this patterning is described later.

In the organic light emitting device 1 of FIGS. 1A and 1B, the upper electrode 23 formed on the organic compound layer 22 is electrically connected to the upper-electrode electrode pad portion 24.

A sealing layer 30 is formed in the organic light emitting device 1 of FIGS. 1A and 1B for the purpose of covering and protecting at least the organic compound layer. In the present invention, however, a protective member for protecting the organic compound layer is not limited to the sealing layer 30 in FIGS. 1A and 1B. The light emitting pixel 20 and the upper-electrode electrode pad portion 24 are formed within the sealing layer 30 as illustrated in FIG. 1B.

Though not shown in FIGS. 1A and 1B, an external connection terminal portion is arranged outside the sealing layer 30. An external connection terminal is a terminal for supplying external signals and power supply voltage to a circuit (not shown). It is preferred for the sealing layer 30 in the present invention to be patterned so as to have an opening that leaves the external connection terminal portion, which is formed on a first principal surface side of the substrate 10, uncovered.

An organic light emitting device of the present invention has at least one organic light emitting element formed on a substrate. In the case where the organic light emitting device has two or more organic light emitting elements, the organic light emitting elements may emit light of the same color or different colors from one another. The organic light emitting device may arrange the two or more organic light emitting elements so that, for example, pixels each of which is a combination of a plurality of organic light emitting elements are arranged in lines or in a matrix, but the present invention is not limited to this arrangement mode. The organic light emitting device of the present invention may use the upper electrode 23 or the lower electrode 21 as an electrode from which light emitted by an emission layer, which forms the organic compound layer 22, is taken out. The mode of taking out light emitted by the emission layer is not limited to an "either-or" mode in which the emitted light is taken out from the upper electrode 23 or the lower electrode 21, and can be a mode in which the emitted light is taken out from both electrodes (21 and 23). If the electrode from which light emitted by the emission layer is taken out is a translucent or transparent electrode, the light can be taken out from the interior of the organic light emitting element that forms the organic light emitting device.

Figure 2A:
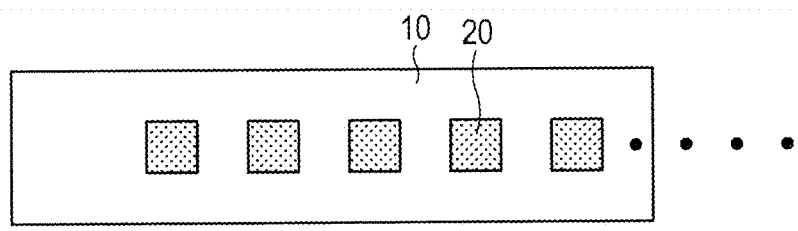
FIGS. 2A, 2B, 2C, and 2D are schematic plan views for illustrating arrangement examples of light emitting pixels that form the organic light emitting device of the present invention.
Figure 2B:
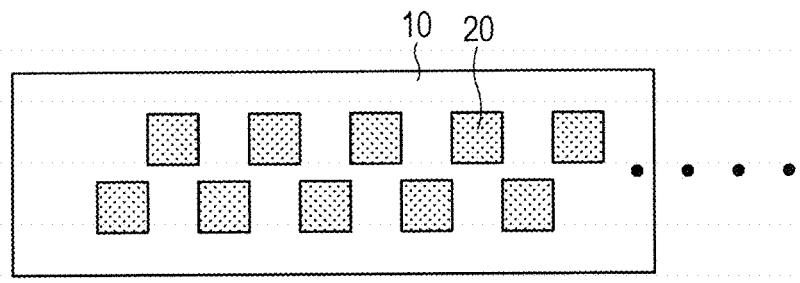
Figure 2C:
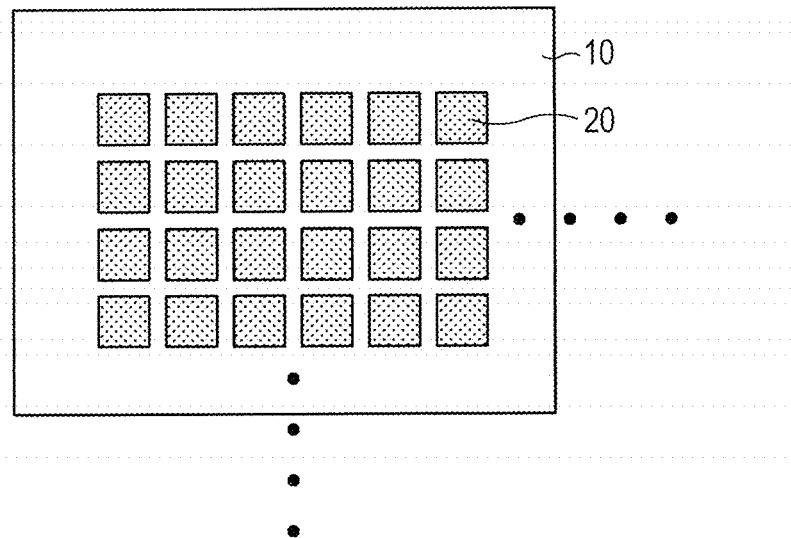
Figure 2D:
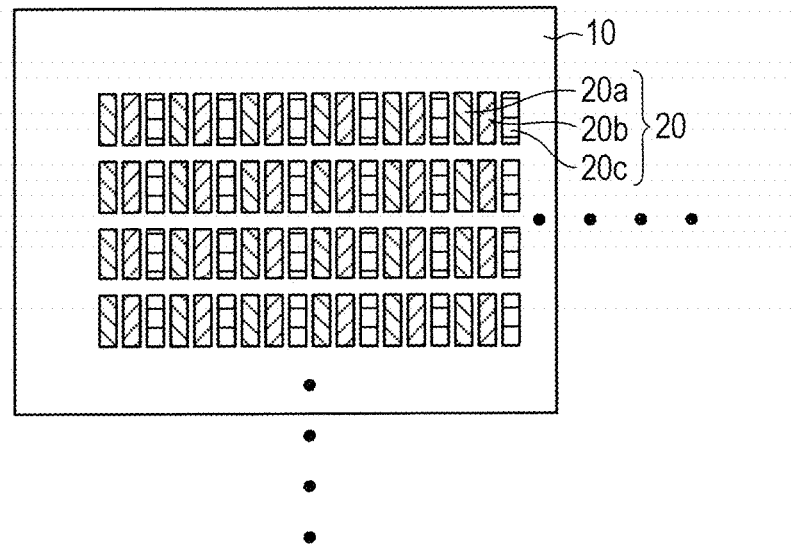

FIGS. 2A to 2D are schematic plan views for illustrating arrangement examples of light emitting pixels that form the organic light emitting device of the present invention. The light emitting pixels 20 in the present invention can be arranged in lines (FIG. 2A), in staggered lines (FIG. 2B), in a two-dimensional matrix (FIG. 2C or FIG. 2D), and the like, but are not limited to those arrangement examples. In the case where the organic light emitting device of the present invention is used as a linear light source for a print head, arranging the light emitting pixels 20 in lines (FIG. 2A) or in staggered lines (FIG. 2B) is preferred. In the case where the organic light emitting device of the present invention is used as a display, a two-dimensional matrix arrangement (FIG. 2C or FIG. 2D) can be employed. In the form of FIG. 2D where each light emitting pixel 20 includes a plurality of types of sub-pixels (20a, 20b, and 20c), in particular, images can be displayed in full color by selecting an appropriate light emitting material for each different type of sub-pixel.

Thin films to be turned into the organic compound layer 22 and the upper electrode 23, which form the organic light emitting device, are described next. In the present invention, a requirement about an angle formed by the slant in section of a film end of the organic compound layer 22 and the surface of the substrate 10 varies depending on the region in which the organic compound layer 22 is formed. Specifically, the requirement varies depending on whether the organic compound layer 22 is formed in a region between the lower electrode and the upper-electrode electrode pad portion or other regions than this region.

More specifically, a portion of the organic compound layer that is formed in a region between the lower electrode 21 and the upper-electrode electrode pad portion 24 has a film end (22a), and, when an angle formed by a slant in section of the film end and the surface of the substrate is given as $\theta_1$, Formula (1) and Formula (2) are satisfied.

$$\tan(\theta_1)=d_1/d_2 \tag{1}$$

$$\tan(\theta_1)<0.2 \tag{2}$$

The symbols $d_1$ and $d_2$ in Formula (1) represent a thickness of the organic compound layer and a taper width in section of the film end of the organic compound layer, respectively.

On the other hand, a portion of the organic compound layer that is formed in at least a part of other regions than the region between the lower electrode 21 and the upper-electrode electrode pad portion 24 has a film end (22b), and, when an angle formed by a slant in section of the film end and the surface of the substrate is given as $\theta_3$, Formula (3) and Formula (4) are satisfied.

$$\tan(\theta_3)=d_3/d_4 \tag{3}$$

$$\tan(\theta_3)\geq 0.2 \tag{4}$$

The symbols $d_3$ and $d_4$ in Formula (3) represent a thickness of the organic compound layer and a taper width in section of the film end of the organic compound layer, respectively.

Figure 3:
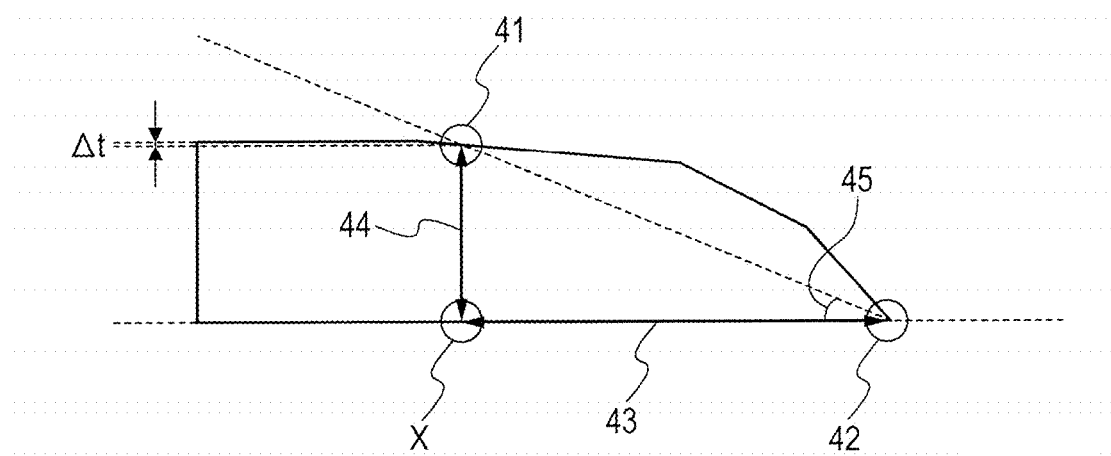
FIG. 3 is a schematic sectional view for illustrating an end of a film that forms the organic light emitting device of FIGS. 1A and 1B.

FIG. 3 is a schematic sectional view for illustrating an end of a film that forms the organic light emitting device of FIGS. 1A and 1B. FIG. 3 is also a diagram for illustrating the shape of a graded thickness region in given films. The film of FIG. 3 is a film to be turned into the organic compound layer 22 or the upper electrode 23.

As illustrated in FIG. 3, an end of the film to be turned into the organic compound layer 22 or the upper electrode 23 is thinner than other portions of the film such as the central portion. The region where the film is thinner than other portions in FIG. 3 is a region called a graded thickness region. Taking a film to be turned into the organic compound layer 22 as an example, a graded thickness region in the organic compound layer is formed between an edge of the substrate 10 and the emission region defining unit, which is at the outermost perimeter of a display region (the emission region 20), in particular, at an end of the film to be turned into the organic compound layer 22.

A portion of a given film that is thinner than a film forming error (−Δt) of the film is denoted by a reference symbol 41, and a portion of the film that has a thickness of 0 nm is denoted by a reference symbol 42. The distance from the point 42 to a point where a vertical line drawn down from the point 41 meets the substrate (a point X), namely, a distance denoted by a reference symbol 43, is defined as a film end taper width of the given film. In the case where the given film is the organic compound layer 22, the distance denoted by the reference symbol 43 is $d_2$ in Formula (1) or $d_4$ in Formula (3). The thickness of the film at the point 41 corresponds to the distance between the point 41 and the point X that is denoted by a reference symbol 44. In the case where the given film is the organic compound layer 22, the distance denoted by the reference symbol 44 is $d_1$ in Formula (1) or $d_3$ in Formula (3). An angle formed by the slant in section of the film end and the substrate surface in FIG. 3 is denoted by a reference symbol 45, and is $\theta_1$ in Formula (1) and Formula (2) or $\theta_3$ in Formula (3) and Formula (4).

The present invention can prevent the disconnection of the upper electrode 23 between the upper-electrode electrode pad portion 24 and the emission region 20 by giving a value that is smaller than 0.2 to $\tan(\theta_1)$, which is calculated by Formula (1) from $d_1$ and $d_2$.

The graded thickness region, which is generated at an end of a film to be turned into the organic compound layer 22, can be reduced in size in the present invention by giving a value of 0.2 or larger to $\tan(\theta_3)$, which is calculated by Formula (3) from $d_3$ and $d_4$. The reduction in size of the graded thickness region reduces a frame region (a region outside the display region, which is formed from a group of light emitting pixels, and stretching from the display region to the substrate edges) in size in the organic light emitting device. The present invention is capable of reducing the width in the lateral direction of an organic light emitting device along which light emitting pixels are formed, and is therefore particularly useful in the case of an organic light emitting device that is small in width.

It is preferred in the present invention that when a slant in section of a film end of the upper electrode 23 forms an angle with the surface of the substrate and the angle is given as $\theta_2$, Formulas (5) and (6) be satisfied.

$$\tan(\theta_2)=d_5/d_6 \quad (5)$$

$$\tan(\theta_2)\geq 0.2 \quad (6)$$

The symbols $d_5$ and $d_6$ in Formula (5) represent a thickness of the upper electrode and a taper width in section of the film end of the upper electrode, respectively.

The graded thickness region, which is generated at an end of a film to be turned into the upper electrode 23, can be reduced in size as in the case of the organic compound layer 22 by giving a value of 0.2 or larger to $\tan(\theta_2)$, which is calculated by Formula (5) from $d_5$ and $d_6$. In the present invention, a preferred value of $\tan(\theta_2)$ is 0.4 or more.

By controlling the film end shapes of films that form the given layers (22 and 23) in the manner described above, the frame region can be made narrow in an organic light emitting device whose frame region is defined by the edges of film forming of at least the organic compound layer 22 and the upper electrode 23. The narrowing of the frame region also increases the number of organic light emitting devices that are yielded from a single sheet of mother glass, which leads to an improvement in productivity.

In the organic light emitting device 1 of FIGS. 1A and 1B, a film end of the organic compound layer 22 is covered with the upper electrode 23. This prevents the seeping of water and oxygen from the end of the film to be turned into the organic compound layer 22, and accordingly remedies the deterioration of the organic compound layer 22 that is caused by the seeping of water, oxygen, and the like in the lateral direction (a direction parallel to the substrate surface) of the film.

In the organic light emitting device of the present invention, it is preferred for an end of the film that is turned into the organic compound layer 22 to have in section a taper width of 5 μm or less, more preferably, 1 μm or less.

The seeping of water and oxygen from an end of the film to be turned into the organic compound layer 22 can be prevented if the film end is covered with at least the sealing layer 30.

[Organic Light Emitting Device Manufacturing Method (the First Embodiment)]

An organic light emitting device manufacturing method of the present invention is described next. FIGS. 4A to 4H are schematic sectional views for illustrating an organic light emitting device manufacturing method according to a first embodiment of the present invention.

Figure 4A:
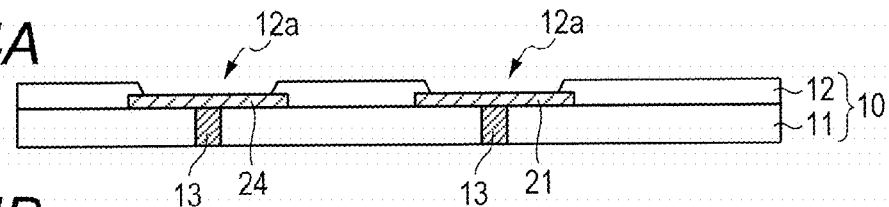
FIGS. 4A, 4B, 4C, 4D, 4E, 4F, 4G, and 4H are schematic sectional views for illustrating a method of manufacturing an organic light emitting device according to a first embodiment of the present invention.

(1-1) Substrate Forming Step (FIG. 4A)

A substrate that is used to build an organic light emitting device is manufactured first (FIG. 4A). The substrate 10 used in this embodiment (the first embodiment) includes at least the interlayer insulating layer 11 and the pixel isolating film 12. In the substrate 10 of FIG. 4A, the lower electrode 21 and the upper-electrode electrode pad portion 24 are formed on the interlayer insulating layer 11 in given locations/regions, and ends of the lower electrode 21 and the upper-electrode electrode pad portion 24 are covered with the pixel isolating film 12. The pixel isolating film 12 has an opening 12a in a region corresponding to one light emitting pixel 20, and an opening 12a at a contact point where the upper-electrode electrode pad portion 24 comes into contact with an upper electrode layer. Though not shown in FIG. 4A, the substrate 10 may include a control circuit for controlling the driving of the organic light emitting device. In the case where the control circuit is included in the substrate 10, the contact holes 13 are formed in portions of the interlayer insulating layer 11 for the purpose of securing electrical connection between the control circuit and the lower electrode 21, and electrical connection between the control circuit and the upper-electrode electrode pad portion 24.

The interlayer insulating layer 11, which forms the substrate 10 of FIG. 4A, is not limited to a particular material, but a material made of silicon nitride (SiN) or silicon oxide (SiO), which is highly insulative, is preferred for the interlayer insulating layer 11.

The lower electrode 21, which is formed on the interlayer insulating layer 11, uses a material selected as one that is suitable for the function of the lower electrode 21 with regards to light emitted by the emission layer (whether the lower electrode 21 transmits the light or reflects the light). In the case where the lower electrode 21 is to reflect the light emitted by the emission layer, an electrode layer having light reflectivity is used for the lower electrode 21. The material of the lower electrode 21 in this case can be a metal material high in light reflectivity, such as aluminum (Al) or silver (Ag). However, the structure of the lower electrode 21 in this case is not limited to a single layer of the metal material high in light reflectivity given above. A multi-layer electrode film that includes a layer of a metal material high in light reflectivity and a layer of a transparent conductive material such as ITO or indium zinc oxide may also be employed as the lower electrode 21. In the case where the lower electrode 21 is to transmit the light emitted by the emission layer, an electrode layer having light transmission property is used for the lower electrode 21. The material of the lower electrode 21 in this case can be a transparent conductive material such as ITO or indium zinc oxide.

In the case where the lower electrode 21 and the upper-electrode electrode pad portion 24 are to be formed simultaneously, the material of the upper-electrode electrode pad portion 24 is the same as that of the lower electrode 21. The lower electrode 21 and the upper-electrode electrode pad portion 24 in the present invention, however, can be formed by separate processes. The material of the upper-electrode electrode pad portion 24 in this case may differ from the material of the lower electrode 21.

The contact holes 13 formed in given regions of the interlayer insulating layer 11 are each filled with a connection wiring material for electrically connecting wiring or the circuit (not shown), which is below the interlayer insulating layer 11, to the lower electrode 21 or the upper-electrode electrode pad portion 24. The connection wiring material can be a highly conductive material but is not limited to a particular material in the present invention.

The material of the pixel isolating film 12 is not particularly limited as long as the material is an insulative material. In the case of organics, however, a material that has polyimide as a main component is preferred and, in the case of inorganics, silicon nitride (SiN), silicon oxide (SiO), or the like is preferred.

Figure 4B:
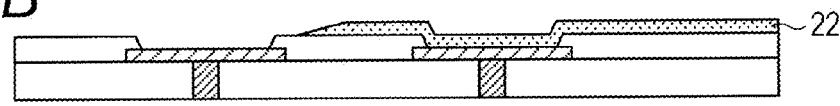

(1-2) Step of Forming a Film for the Organic Compound Layer (FIG. 4B)

A film to be turned into the organic compound layer 22 is formed next on the lower electrode 21 (FIG. 4B). The organic compound layer 22 formed on the lower electrode 21 and others in this step is a single layer or a laminate including a plurality of layers in which at least an emission layer is included. In the case where the organic compound layer 22 includes a plurality of layers, specific examples of other layers than the emission layer include a hole injection layer, hole transport layer, an electron blocking layer, a hole blocking layer, an electron transport layer, and an electron injection layer. The layer structure of the organic compound layer 22 depends to some degree on the characteristics of the upper electrode 23, which is formed in a later step, but is not particularly limited. The characteristics of the upper electrode 23 here mean mainly carriers that are injected from the upper electrode 23. In the case where the carriers injected from the upper electrode 23 are holes (positively charged carriers), layers between the lower electrode 21 and the emission layer are for injecting and transporting electrons, and layers between the upper electrode 23 and the emission layer are for injecting and transporting holes. In the case where the carriers injected from the upper electrode 23 are electrons (negatively charged carriers), the layers between the lower electrode 21 and the emission layer are for injecting and transporting holes, and the layers between the upper electrode 23 and the emission layer are for injecting and transporting electrons.

The organic compound layer 22 in the present invention can be formed by a film forming method that has been commonly used (vacuum vapor deposition, coating, or the like). In the present invention, however, forming a film of the organic compound layer 22 needs to fulfill the following requirements.

[Requirement 1] The organic compound layer 22 does not cover the upper-electrode electrode pad portion 24.

[Requirement 2] When the taper angle of a film end 22b of the organic compound layer 22, which is formed in a region between the upper-electrode electrode pad portion 24 and the emission region 20, is given as $\theta_{org}$, $\tan(\theta_{org})$ is less than 0.2.

With Requirement 1 fulfilled, the organic compound layer 22 does not hinder electrical connection between the upper electrode 23 and the upper-electrode electrode pad portion 24 when the upper electrode 23 is formed in a later step. With Requirement 2 fulfilled, the risk of disconnection in a portion of the upper electrode 23 that is located on the film end of the organic compound layer 22, which is a risk caused by the slope of the film end of the organic compound layer 22, is reduced. In other words, Requirement 2 is laid down because a steep slope of the film end of the organic compound layer 22 increases the chance of disconnection in a portion of the upper electrode 23 that is located on the film end of the organic compound layer 22.

Using a time-proven vapor deposition method to form a film of the organic compound layer 22 is preferred in order to fulfill the two requirements given above. Specifically, the film of the organic compound layer 22 can be formed in a desired region by employing a vapor deposition method that uses a mask in which an opening is made in the given region. The taper angle $\theta_{org}$ of the film end of the organic compound layer 22 formed by a vapor deposition method tends to satisfy $\tan(\theta_{org}) < 0.2$. A film end taper width d of the organic compound layer 22 formed by a vapor deposition method is calculated from a distance D between the substrate and the mask and a maximum emission angle ω of a vapor deposition source by Formula (7):

$$d = D \times \sin \omega \quad (7)$$

Formula (7) shows that, when D (the distance between the substrate and the mask) is small, d (the film end taper width) is small as well. However, the distance D that is small causes the risk of transfer of a clinging foreign substance from the mask to the substrate 10 and the risk of damage to the substrate 10 from a contact between the mask and the substrate 10.

Setting ω (the maximum emission angle of the vapor deposition source) small has a drawback of a low vapor deposition rate. A film formed by vapor deposition that uses a mask therefore generally has a film end taper width of approximately 2 μm to 20 μm. The value of $\tan(\theta_{org})$ at a film thickness of 400 nm or less, which is a general thickness of organic compound layers, is accordingly 0.2 at maximum, whereas $\tan(\theta_{org})$ in the present invention is less than 0.2.

Each of the layers forming the organic compound layer 22 is described. The hole injection layer is formed between the hole transport layer and an electrode for injecting holes (an anode) to improve the ease of hole injection and thereby contribute to make the organic light emitting element that forms the organic light emitting device low in voltage and long in life. The hole injection layer in the present invention is also a layer containing an organic compound that has an electron-withdrawing substituent. In the present invention, it is preferred for at least one of the layers forming the organic compound layer 22 to function as a layer that covers an end of the hole injection layer to protect the hole injection layer.

The hole transport layer is a layer made of a material that has a main function of transporting holes.

The electron blocking layer is formed between the emission layer and the hole transport layer and has a function of blocking the leakage of electrons from the emission layer to the anode side to confine electrons within the emission layer. The electron blocking layer is a layer for increasing the efficiency of the organic light emitting element that forms the organic light emitting device.

The emission layer is a layer mainly for obtaining light emission through the recombination of holes and electrons, and is made generally from two types of material called a host and a guest. The guest is a light emitting material and the content (weight ratio) of the guest in relation to the entire emission layer is about 10% or less. The emission layer may contain an additional material in addition to the host and the guest from the viewpoint of element characteristics.

The hole blocking layer is formed between the electron transport layer and the emission layer, and has a function of blocking the leakage of holes from the emission layer to the cathode side to confine holes in the emission layer. The hole blocking layer is a layer for increasing the efficiency of the organic light emitting element that forms the organic light emitting device.

The electron transport layer is a layer mainly for transporting electrons.

The electron injection layer is formed between the electron transport layer and an electrode for injecting electrons (a cathode) to mainly improve the ease of electron injection and thereby contribute to make the organic light emitting element that forms the organic light emitting device low in voltage and long in life.

The lack of or the duplication of any layer in the multilayer structure described above does not affect the film end structure of the resultant film, which serves as the organic compound layer 22. Consequently, the effects of the present invention are not influenced by the specifics of the multilayer structure of the organic compound layer. The order in which the layers forming the organic compound layer 22 are layered is determined by whether the lower electrode 21 is an anode or a cathode, but is not limited to a particular order in the present invention.

This embodiment uses at least water and other solvents in a step of patterning the upper electrode 23 and the organic compound layer 22, which is described later. Preferred materials of the layers that form the organic compound layer 22 are therefore materials that are insoluble in at least water. The electron injection layer, in particular, which is formed commonly from an alkaline metal or an alkaline earth metal for the ease of electron injection, uses in this embodiment an electron injecting material that is low in water solubility such as an organic metal complex because alkaline metals and alkaline earth metals may react with water upon contact and dissolve. The electron injection layer may be a single layer or a laminate including a plurality of layers.

Figure 4C:
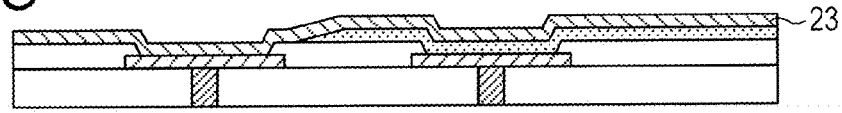

(1-3) Upper Electrode Forming Step (FIG. 4C)

A conductive film to be turned into the upper 22 electrode 23 is formed next on the organic compound layer (FIG. 4C). The conductive film to be turned into the upper electrode 23 can be formed by a known method such as vapor deposition or sputtering in this embodiment.

The upper electrode 23 uses a material selected as one that is suitable for the function of the upper electrode 23 with regards to light emitted by the emission layer (whether the upper electrode 23 transmits the light or reflects the light). In the case where the upper electrode 23 is to reflect the light emitted by the emission layer, an electrode layer having light reflectivity is used for the upper electrode 23. The material of the upper electrode 23 in this case can be a metal material high in light reflectivity, such as aluminum (Al) or silver (Ag). However, the structure of the upper electrode 23 in this case is not limited to a single layer of the metal material high in light reflectivity given above. A multi-layer electrode film that includes a layer of a metal material high in light reflectivity and a layer of a transparent conductive material such as ITO or indium zinc oxide may also be employed as the upper electrode 23. In the case where the upper electrode 23 is to transmit the light emitted by the emission layer, an electrode layer having light transmission property is used for the upper electrode 23. The material of the upper electrode 23 in this case can be a transparent conductive material such as ITO or indium zinc oxide. Layers made of those materials are known to be much denser than the organic compound layer 22 and accordingly low in gas permeability. Covering a film end of the organic compound layer 22 with the upper electrode 23 at the time the first upper electrode layer 23 is formed therefore protects the organic compound layer 22 under the upper electrode 23 from the permeation of water and gas such as oxygen.

When mask vapor deposition is used to form the conductive film to be turned into the upper electrode 23, the ratio of the thickness and taper width of this conductive film is less than 0.2 as is the case for the organic compound layer 22. The thickness-taper width ratio of the conductive film that is formed by sputtering is even smaller because more film material flows over in sputtering than in vapor deposition.

(1-4) Step of Patterning the Upper Electrode and the Organic Compound Layer (FIGS. 4D to 4G)

After the conductive film to be turned into the upper electrode 23 is formed, the upper electrode 23 and the organic compound layer 22 are patterned. One of the purposes of this step is to make the frame region narrow by giving a large gradient to an end of the processed film (patterned end). The ratio of the thickness and taper width of the film is less than 0.2 in mask vapor deposition, which has hitherto been used in patterning. Photolithography or a similar method is used here to accomplish the narrowing of the frame region by making the slope of the patterned end steep, specifically, by setting the thickness-taper width ratio of the film to 0.2 or more. Patterning that uses photolithography where the taper width is within 1 μm is preferred because the organic compound layer 22 having a general thickness of organic compound layers (400 nm or less) can have a thickness-taper width ratio of 0.4 or more when patterned by photolithography.

The patterning of the upper electrode 23 and the organic compound layer 22 by photolithography is described below.

Figure 4D:
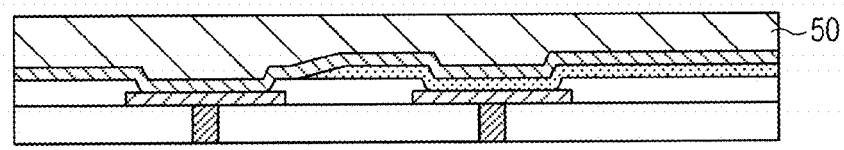

First, a resist layer 50 made of positive resist is formed by application (FIG. 4D), and is exposed to exposure light 52 through a photomask 51 (FIG. 4E) in a region to be removed by etching, and then developed, to thereby form a resist pattern. With the resist pattern as a protective film, portions of the upper electrode 23 and the organic compound layer 22 that are not covered with the resist pattern and are exposed are removed next by etching (FIG. 4F). The etching can use an existing method such as wet etching or dry etching. However, dry etching, which is free of the fear of side etching by a solvent, is preferred. The resist pattern is then removed and the substrate is washed and dried, thereby completing the patterning of the organic compound layer 22 and the upper electrode 23 (FIG. 4G). The drying is for desorbing moisture that has been used in the washing step executed after the removal of the resist pattern and that has been adsorbed into the organic compound layer 22 or an insulating layer of a base circuit.

The film end of the organic compound layer 22 and the upper electrode 23 that are processed by the photolithography process described above is 0.2 or more in $\tan(\theta)$, which has been described with reference to FIG. 3. This reduces waste regions in layout. The structure in which $\tan(\epsilon)$ is 0.2 or more also acquires high durability after a sealing step.

The upper electrode 23 in the present invention is formed mainly in the form of a sputtering film, an EB vapor deposition film, or the like, and, in sputtering or EV vapor deposition, the degree of vacuum is even lower and an even larger amount of material flows over than when the organic compound layer 22 is formed. Processing the conductive film to be turned into the upper electrode 23 in this step in a manner that makes the value of tan(θ) 0.2 or larger therefore reduces the size of the frame region even more.

In this step, a protective layer may be placed on the upper electrode 23 before the resist layer 50 is formed. The upper electrode 23, which is ultimately patterned by photolithography or other methods, may be formed over the entire surface of the substrate 10 or within a minimum range of film forming by the process as long as the conductive film to be turned into the upper electrode 23 is formed in a region where the upper electrode 23 is to be formed.

Figure 4E:
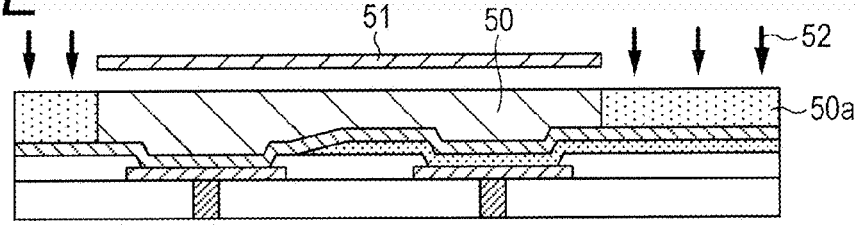
Figure 4F:
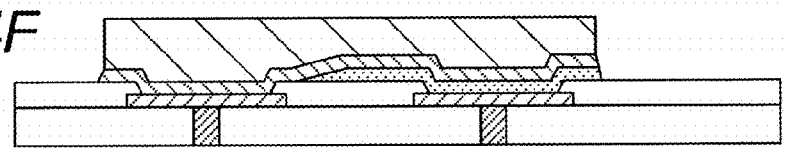
Figure 4G:
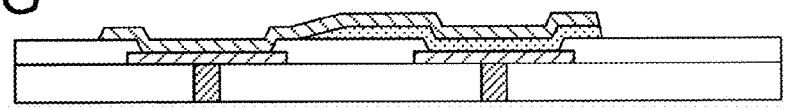
Figure 4H:
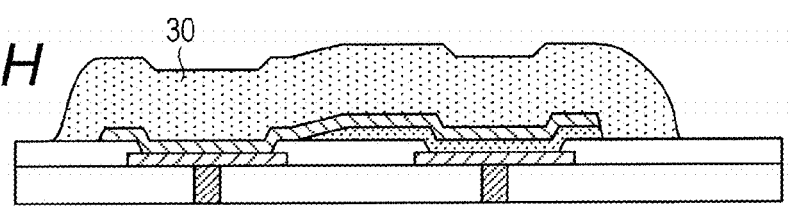

(1-5) Sealing Step (FIG. 4H)

The organic light emitting element that forms the organic light emitting device of the present invention is vulnerable to water and oxygen, and therefore requires a sealing step. After the upper electrode 23 is formed, the organic light emitting element and the upper-electrode electrode pad portion 24, which form the organic light emitting device, may be sealed inside a glass cap or the like, or may be sealed with a thin sealing film made from an inorganic material. Sealing the organic light emitting element and the upper-electrode electrode pad portion 24 with a thin sealing film made from an inorganic material that is capable of making a sealing frame narrow is preferred in order to improve the number of organic light emitting devices that are yielded from a single sheet of mother glass. In this embodiment, the sealing layer 30 (thin sealing film) is formed on the upper electrode 23 (FIG. 4H). The material of the sealing layer 30 can be an inorganic material that is highly moisture-proof, such as silicon nitride (SiN), silicon oxide (SiO), or aluminum oxide (AlO). However, the material of the sealing layer 30 itself is not a particular concern in the present invention as long as sealing by a thin film is accomplished.

In the present invention, the formed sealing layer 30 may be patterned for the purpose of exposing an external connection electrode pad for connecting to an external circuit, or other purposes. It is preferred in the present invention to cover an end of the upper electrode 23 entirely with the sealing layer 30. This way, the seeping of water and oxygen components from the end of the upper electrode 23 can be prevented more thoroughly, and an effect of improving the durability of the element that forms the organic light emitting device even more can be expected.

It is also preferred in the present invention to cover ends of the patterned organic compound layer 22 and upper electrode 23 entirely with the sealing layer 30, which is in the form of a thin film. Covering the end of the organic compound layer 22 with the sealing layer 30 in this step and thus protecting the organic light emitting element from water and oxygen is preferred because the patterning leaves the end of the organic compound layer 22 exposed.

[Organic Light Emitting Device Manufacturing Method (the Second Embodiment)]

FIGS. 5A to 5E are schematic sectional views for illustrating an organic light emitting device manufacturing method according to a second embodiment of the present invention. The following description focuses on differences from the first embodiment.

Figure 5A:
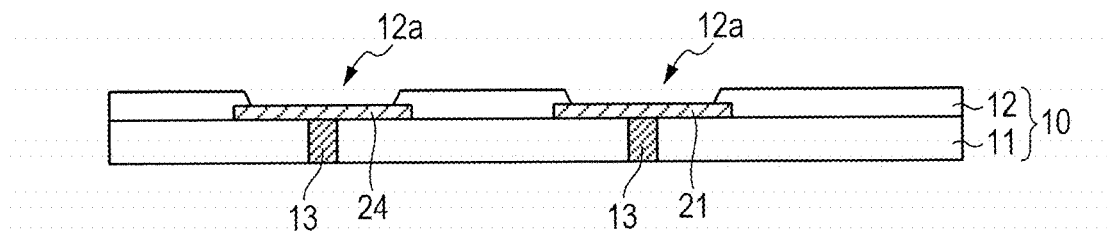
FIGS. 5A, 5B, 5C, 5D, and 5E are schematic sectional views for illustrating a method of manufacturing an organic light emitting device according to a second embodiment of the present invention.

(2-1) Substrate (FIG. 5A)

The substrate 10 (a substrate with electrodes) manufactured in the first embodiment can be used also in the manufacture of an organic light emitting device according to this embodiment.

Figure 5B:
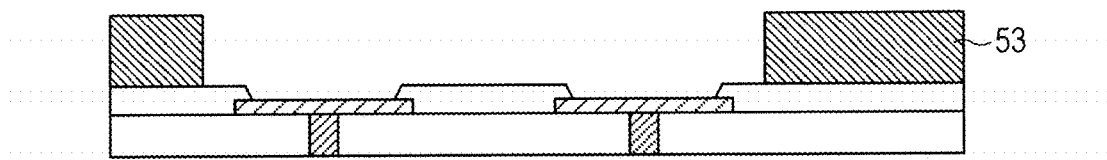

(2-2) Step of Forming a Lift-off Layer and a Photoresist Film (FIG. 5B)

In this embodiment, a lift-off layer 53 is first formed over the entire surface of the substrate 10. The lift-off layer 53 is formed from a material soluble in a solvent that does not dissolve the organic compound layer 22. For example, a water-soluble polymer material is preferred. In the case where a water-soluble polymer is used as the material of the lift-off layer 53, the lift-off layer 53 can easily be formed by coating such as spin coating or dip coating.

The resist layer 50 that contains a photosensitive material is formed on the lift-off layer 53 (FIG. 5B). The resist layer 50 is formed by a wet film forming method such as coating, and a solvent used to form the resist layer 50 is not particularly limited as long as the solvent does not dissolve the underlying layer (the lift-off layer 53). If there is a possibility that the solvent used to form the resist layer 50 might erode the lift-off layer 53, a protective layer (not shown) made from an inorganic compound such as silicon nitride or silicon oxide may be inserted between the lift-off layer 53 and the resist layer 50. This embodiment employs a photolithography process that uses a positive photoresist, but may instead employ a photolithography process that uses a negative photoresist.

(2-3) Lift-off Layer Patterning Step (FIG. 5B)

Next, the resist layer 50 and the lift-off layer 53 are selectively removed from a region where the patterned organic compound layer 22 and upper electrode 23 are to be formed (a region in which the light emitting pixel 20 is to be formed). In the case where the resist layer 50 is a positive resist, for example, the resist layer 50 is masked with the mask 51, which has an opening in the region where the organic compound layer 22 is to be formed, and then exposed to the exposure light 52 as in FIG. 4E, thereby forming a resist layer 50a, which has been exposed so that the light emitting pixel 20 is surrounded. In the case where the resist layer 50 is formed from a negative resist, on the other hand, the resist layer 50a exposed in the same pattern can be formed by using a mask in which the opening pattern is reversed.

The exposed resist layer 50a is next removed by developing the resist layer 50a with a developer. The patterned resist layer 50 is then used as a mask for dry etching. The specific method of the dry etching is not particularly limited as long as a gas capable of etching the lift-off layer 53 is used. After the lift-off layer 53 is processed by the dry etching, the remaining resist layer 50 may be removed with the use of a remover or the like, or by further dry etching. Alternatively, the remaining resist layer 50 may remain as it is. Forming the resist layer 50 on the lift-off layer 53 to an appropriate thickness is preferred because then the resist layer 50 can be removed at the same time as the dry etching of the lift-off layer 53.

After the resist layer 50 is removed, a washing step may be executed. After the washing step, a drying step may be inserted in order to desorb moisture that has been generated in the washing step and may have been adsorbed on an insulating layer of a base circuit.

This step leaves the lower electrode 21 exposed and it is preferred to perform pretreatment on the substrate 10 before the next step (a step of forming the organic compound layer 22). Specifically, argon plasma treatment, oxygen plasma treatment, UV irradiation treatment, heat treatment, or the like is performed on the substrate 10. The pretreatment adjusts the ease of electron injection of the lower electrode 21 and removes contaminants or the like that may be found on the lower electrode 21.

Figure 5C:
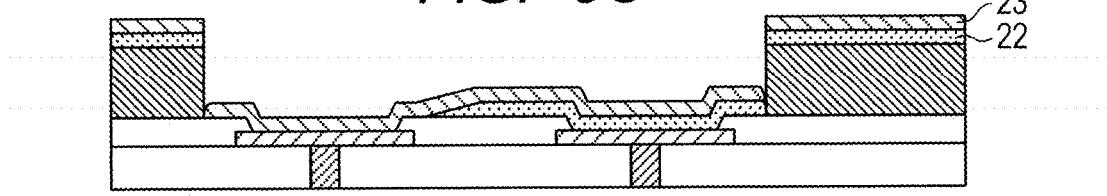

(2-4) Step of Forming and Patterning the Organic Compound Layer and the Upper Electrode (FIG. 5C)

Next, the organic compound layer 22 and the upper electrode 23 are formed in order (FIG. 5C). Films to be turned into the organic compound layer 22 and the upper electrode 23 are both formed over the entire surface of the substrate 10, and are respectively formed by the film forming methods that are used in the first embodiment.

Lift-off is performed next to remove the lift-off layer 53 and portions of the organic compound layer 22 and the first upper electrode layer 23 that are located above the lift-off layer 53. (FIG. 5D) Using water in the lift-off is preferred because the solubility of organic materials in water is low. The lift-off may be carried out through a dip in water, or a dip in water plus exposure to ultrasonic waves, or the spraying of water onto the substrate 10 from a two-fluid nozzle.

Figure 5D:
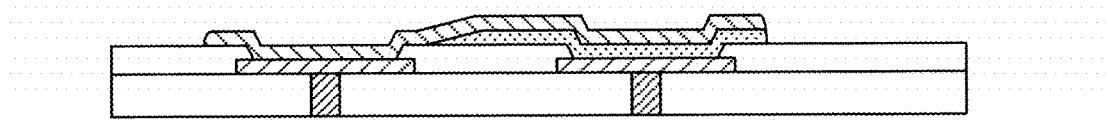
Figure 5E:
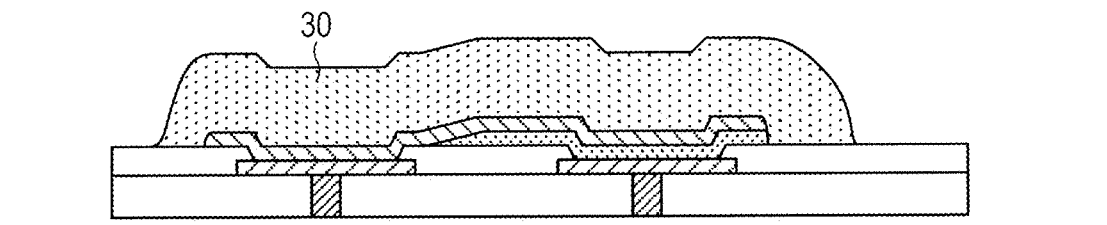

(2-5) Sealing Step (FIG. 5E)

The sealing layer 30 is then formed, to thereby complete the organic light emitting device. A specific method employed in this step to form the sealing layer 30 can be the method described in the first embodiment.

The organic light emitting device according to the present invention may further include an active element for controlling the light emission of the organic light emitting element that forms the organic light emitting device. The active element can be a transistor or a switching element such as an MIM element.

[Active Element]

The active element connected to the organic light emitting element may include an oxide semiconductor in an active region of the active element. The oxide semiconductor that is a material of the active element may be amorphous or crystalline, or a mixture of the two. "Crystal" here means one of single crystal, micro crystal, and crystal in which a particular axis such as the c-axis is oriented. However, the active element is not limited thereto and may use a mixture of at least two types out of those plurality of types of crystal.

(Application of the Organic Light Emitting Device)

Next, the application of the organic light emitting element of the present invention is described. The organic light emitting device of the present invention can be used as a constituent member for a display device or lighting device. In addition, the device finds use in applications such as an exposure light source for an image forming device of an electrophotographic system, a backlight for a liquid crystal display device, and a light emitting device including a white light source with a color filter. The color filter includes a filter that individually transmit light beam of each color, i.e., red, green, or blue color.

A display device of the present invention includes the organic light emitting device of the present invention in its display portion. The display portion includes a plurality of pixels.

In addition, the pixels each include the organic light emitting device of the present invention and a transistor as an example of an active element (switching element) or amplifying element configured to control emission luminance, and the anode or cathode of the organic light emitting element and the drain electrode or source electrode of the transistor are electrically connected to each other. The display device can be used as an image display device for a PC or the like. The transistor is, for example, a TFT element and the TFT element is formed on, for example, the insulating surface of a substrate.

The display device may be an image information processing device that includes an image input portion configured to input image information from, for example, an area CCD, a linear CCD, or a memory card, and an information processing portion configured to process the image information, and displays an input image on its display portion.

In addition, the display portion of an imaging device or inkjet printer may have a touch panel function. The drive system of the touch panel function is not particularly limited.

In addition, the display device may be used in the display portion of a multifunction printer.

A lighting device is a device configured to light, for example, the inside of a room. The lighting device may emit light having any one of the following colors: a white color (having a color temperature of 4,200 K), a daylight color (having a color temperature of 5,000 K), and colors ranging from blue to red colors.

A lighting device of the present invention includes the organic light emitting device of the present invention and an AC/DC converter circuit (circuit configured to convert an AC voltage into a DC voltage) connected to the organic light emitting device and configured to supply a driving voltage. The lighting device may further include a color filter. In addition, the lighting device of the present invention may include a heat sink for discharging heat in the lighting device to the outside.

An image forming device of the present invention is an image forming device including: a photosensitive member; a charging unit configured to charge the surface of the photosensitive member; an exposing unit configured to expose the photosensitive member to form an electrostatic latent image; and a developing unit configured to supply a developer to the photosensitive member, to thereby develop the electrostatic latent image formed on the surface of the photosensitive member. Here, the exposing unit to be arranged in the image forming device includes the organic light emitting device of the present invention.

In addition, the organic light emitting device of the present invention can be used as a constituent member for an exposing device configured to expose a photosensitive member. An exposing device including the organic light emitting device of the present invention is, for example, an exposing device in which the organic light emitting elements that form the organic light emitting device of the present invention are placed to form a line along a predetermined direction.

Figure 6:
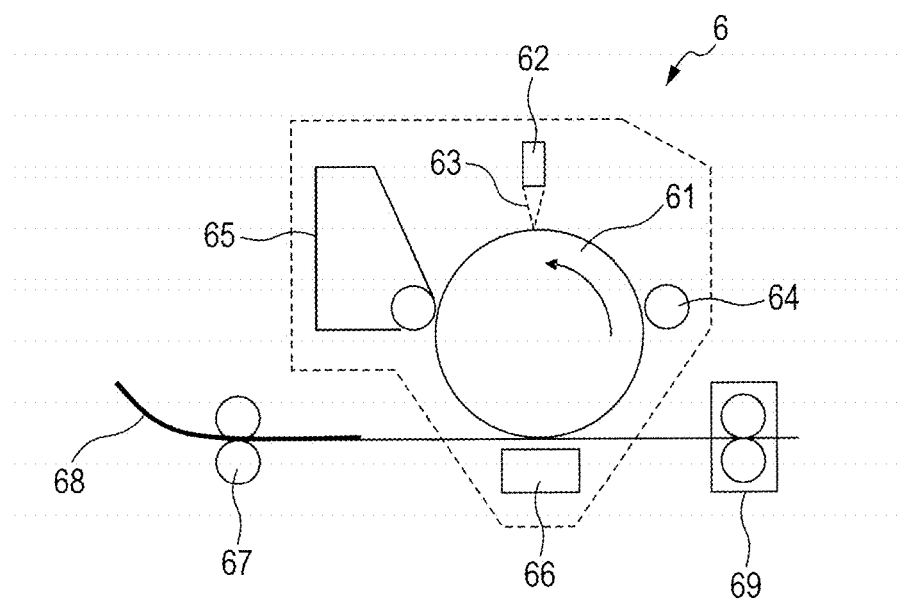
FIG. 6 is a schematic view for illustrating an example of an image forming device that includes the organic light emitting device according to the present invention.

FIG. 6 is a schematic view for illustrating an example of an image forming device that includes the organic light emitting device according to the present invention. An image forming device 6 of FIG. 6 includes a photosensitive member 61, an exposure light source 62, a charging portion 64, a developing device 65, a transferring device 66, a conveying roller 67, and a fixing device 69.

In the image forming device 6 of FIG. 6, light 63 is irradiated from the exposure light source 62 to the photosensitive member 61, to thereby form an electrostatic latent image on the surface of the photosensitive member 61. In the image forming device 6 of FIG. 6, the exposure light source 62 is the organic light emitting device according to the present invention. In addition, in the image forming device 6 of FIG. 6, the developing device 65 has toner and the like. In the image forming device 6 of FIG. 6, the charging portion 64 is arranged for charging the photosensitive member 61. In the image forming device 6 of FIG. 6, the transferring device 66 is arranged for transferring a developed image onto a recording medium 68 such as paper. The recording medium 68 is conveyed by the conveying roller 67 to the transferring device 66. In the image forming device 6 of FIG. 6, the fixing device 69 is arranged for fixing the image formed on the recording medium 68.

FIG. 7A and FIG. 7B are each a schematic plan view outlining a specific example of the exposure light source (exposing device) that forms the image forming device 6 of FIG. 6, and FIG. 7C is a schematic view outlining a specific example of the photosensitive member that forms the image forming device 6 of FIG. 6. FIG. 7A and FIG. 7B have the following feature in common: a plurality of emission portions 62a each including the organic light emitting element are placed in line on the exposure light source 62 along the long axis direction of an elongated substrate 28a. In addition, the arrow represented by reference symbol 62b represents a column direction in which the emission portions 62a are arranged. The column direction is the same as the direction of the axis about which the photosensitive member 61 rotates.

FIG. 7A illustrates a form in which the emission portions 62a are placed along the axis direction of the photosensitive member 61. On the other hand, FIG. 7B illustrates a form in which the emission portions 62a are alternately placed in the column direction in a first column α and a second column β. In FIG. 7B, the first column α and the second column β are placed at different positions in a row direction.

In addition, in FIG. 7B, while a plurality of emission portions 62α are placed at a certain interval in the first column α, the second column β has an emission portion 62β at a position corresponding to an interval between the emission portions 62α in the first column α. That is, in the exposure light source of FIG. 7B, the plurality of emission portions are placed at a certain interval in the row direction as well.

The following rewording is permitted: the exposure light source of FIG. 7B is in a state in which the emission portions (62α and 62β) forming the exposure light source are placed in, for example, a lattice, hound's-tooth, or checkered pattern.

FIG. 8 is a schematic view for illustrating an example of a lighting device that includes the organic light emitting element according to the present invention. A lighting device 7 of FIG. 8 includes an organic light emitting element 71 formed on a substrate (not shown) and an AC/DC converter circuit 72. In the lighting device 7 of FIG. 8, the organic light emitting element 71, which forms the lighting device 7, is the organic light emitting device of the present invention, or a constituent member of the organic light emitting device of the present invention. In addition, the lighting device of FIG. 8 may include a heat sink (not shown) corresponding to a heat discharging portion for discharging heat in the device to the outside on, for example, a substrate surface on a side opposite to the side on which the organic light emitting element 71 is mounted.

As described above, the driving of the organic light emitting device of the present invention enables display that has good image quality and is stable over a long time period, for example.

Now, the present invention is described by way of Examples. A substrate forming step, which is described later, uses a silicon substrate as a starting material, but may instead use a transparent substrate such as a glass substrate. Organic light emitting devices manufactured in Examples each include an emission layer that emits light of a particular color (for example, a blue emission layer). However, the color of light emitted by the emission layer in the present invention is not limited to those in Examples. The organic light emitting device may emit from inside its display region light of a single color (unicolor) or light of two or more different colors (multicolor). The present invention is also not limited to a particular arrangement of light emitting pixels.

Example 1

The organic light emitting device 1 of FIGS. 1A and 1B was manufactured by following the manufacturing process of FIGS. 4A to 4H. The emission layer here is a blue emission layer, but the present invention is not limited thereto. The present invention is also not limited to a particular arrangement of light emitting pixels.

(1) Substrate Forming Step (FIG. 4A)

The organic light emitting device 1 of FIGS. 1A and 1B was manufactured by following the manufacturing process of FIGS. 4A to 4H.

An n-type silicon semiconductor substrate was used as a starting material to manufacture a substrate with circuits in which base driving circuits were formed through the following typical steps (hereinafter referred to as substrate 10). The substrate with circuits manufactured here is a substrate having Al wiring, and the manufacturing flow of the substrate with circuits can follow a normal semiconductor process. Normally employed semiconductor processes such as using Cu wiring, using the double-gate structure in a transistor, and inserting a low-concentration impurity layer between a source-drain and a channel are applicable to the manufacturing flow of the substrate with circuits.

1) Forming a LOCOS region by oxidation (LOCOS stands for Local Oxidation of Silicon)
2) Forming a P-type well structure by ion implantation
3) Forming a gate oxide film by oxidation
4) Forming a poly Si gate electrode
5) Forming a source-drain structure by ion implantation
6) Forming an interlayer insulating film and performing CMP
7) Forming a contact hole
8) Filling the contact hole with tungsten and performing CMP
9) Forming Al wiring
10) Repeating 6) to 9)
11) Forming an interlayer insulating film 11 and performing CMP
12) Forming a contact hole
13) Filling the contact hole with tungsten and performing CMP
14) Forming a lower electrode 21
15) Forming, if necessary, pixel isolating film 12 that covers the periphery of the lower electrode.

The lower electrode 21 in Example 1 was an electrode that had a function of reflecting light. Specifically, an Ag film was formed first on the entire surface of the interlayer insulating layer 11 (including portions where the contact holes 13 were formed) to a thickness of 100 nm, and an indium tin oxide (ITO) film was formed next on the Ag film to a thickness of 25 nm, to thereby form a multi-layer electrode film. Next, a known photolithography method was used to pattern the multi-layer electrode film including the Ag film and the ITO film. The upper-electrode electrode pad portion 24 having the same multi-layer structure as that of the lower electrode 21 was thus formed along with the lower electrode 21. Those electrodes were respectively connected to drive circuits (not shown) located in a lower layer of the substrate 10, by tungsten wiring filling the contact holes 13.

Next, a silicon nitride film was formed by CVD to a thickness of 100 nm on the entire surface of the substrate 10 (above the lower electrode 21, the upper-electrode electrode pad portion 24, and the interlayer insulating layer 11). A film of a photoresist was formed on the silicon nitride film as a resist layer. The formed resist layer was next patterned by photolithography into a given shape. With the patterned resist layer as a mask, as illustrated in FIG. 4A, dry etching using a $CF_4$ gas was performed to form the openings 12a in a region on which the lower electrode 21 was to be formed and a region on which the upper-electrode electrode pad portion 24 was to be formed. Next, a resist residue left on the pixel isolating film 12 by the dry etching was removed by dry etching with the use of an oxygen gas. Next, the substrate 10 on which the pixel isolating film 12 and the underlying layers had been formed was washed with the use of a commercially available single-wafer washing machine by two-fluid washing, or by pure water washing combined with mega-sonic waves, to wash the surface of the substrate 10. The substrate 10 illustrated in FIG. 4A was thus manufactured. The substrate 10 manufactured in Example 1 had a plurality of light emitting pixels 20 arranged in staggered lines as illustrated in FIG. 2B.

(2) Forming the Organic Compound Layer (FIG. 4B)

The organic compound layer 22 was formed above the substrate 10 and the lower electrode 21 by vacuum vapor deposition with the use of a mask having no openings in at least a region where the upper-electrode electrode pad portion 24 was to be formed. Organic compounds used in Example 1 are listed below.

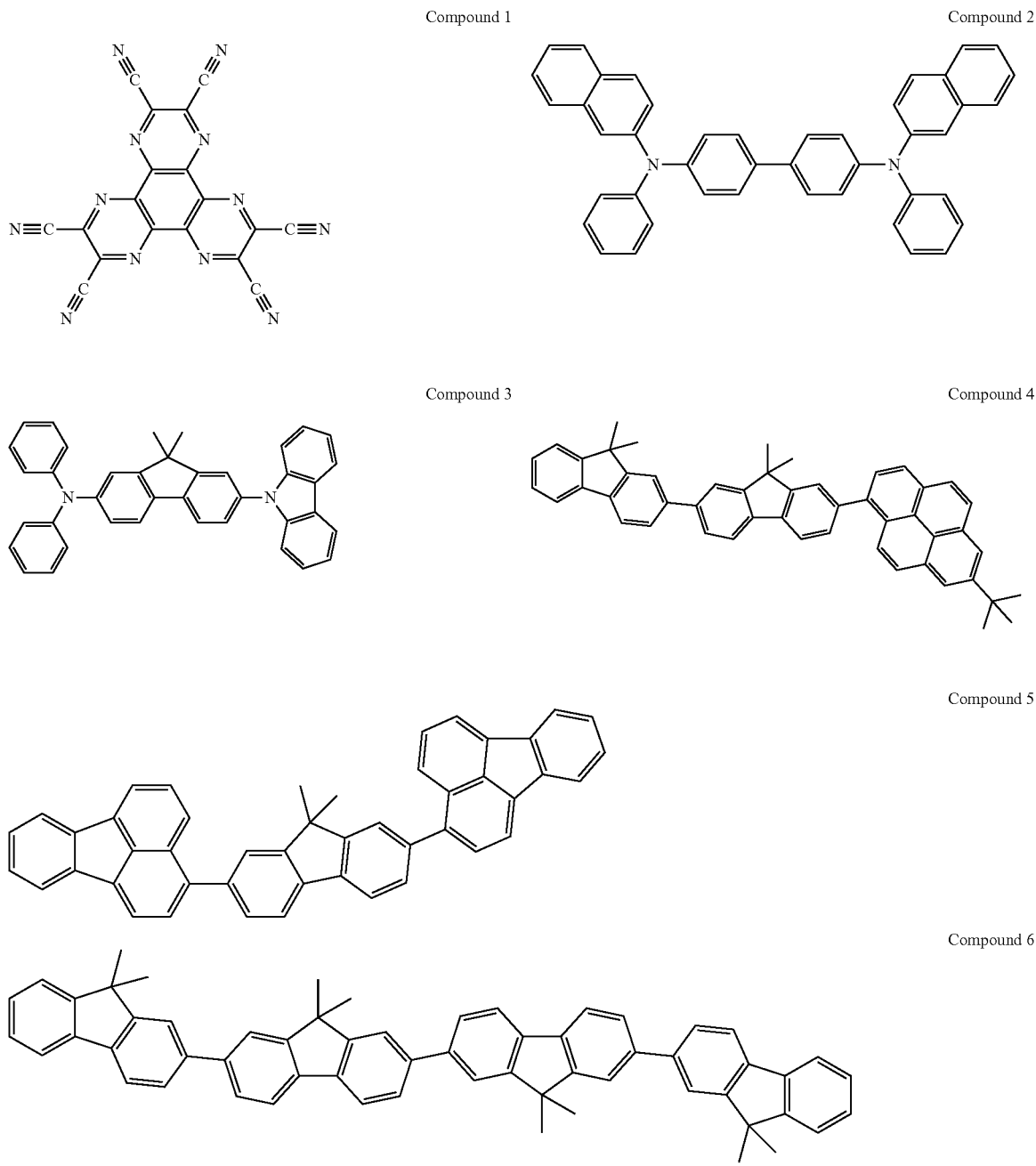

Compound 1

Compound 2

Compound 3

Compound 4

Compound 5

Compound 6

-continued

Compound 7

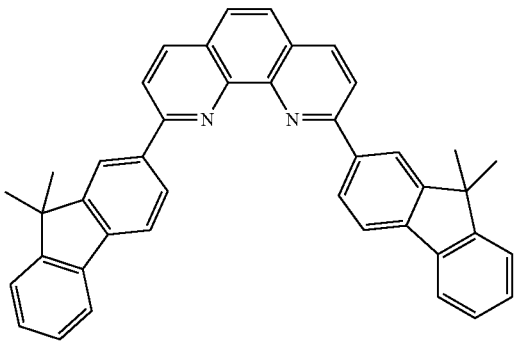

Compound 8

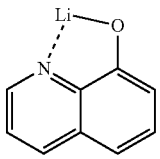

First, UV ozone treatment was performed on the exposed lower electrode 21. Next, a film of Compound 1 was formed on the lower electrode 21 to a thickness of 3 nm to form a hole injection layer. A film of Compound 2 was formed on the hole injection layer to a thickness of 100 nm to form a hole transport layer. A film of Compound 3 was formed on the hole transport layer to a thickness of 10 nm to form an electron blocking layer.

Next, an emission layer was formed on the electron blocking layer to a thickness of 20 nm by co-evaporation of Compound 4 (the host) and Compound 5 (the guest: a light emitting material). The emission layer was formed so that the content of Compound 5 to the whole emission layer was 1 weight percent (wt %). A film of Compound 6 was formed on the emission layer to a thickness of 10 nm to form a hole blocking layer. A film of Compound 7 was formed on the hole blocking layer to a thickness of 40 nm to form an electron transport layer. An electron injection layer was formed on the electron transport layer to a thickness of 15 nm by co-evaporation of Compound 7 and Compound 8. The electron injection layer was formed so that the weight concentration ratio of Compound 7 and Compound 8 was 1:1.

The organic compound layer 22 in which the hole injection layer, the hole transport layer, the electron blocking layer, the emission layer, the hole blocking layer, the electron transport layer, and the electron injection layer were layered in the order stated was formed in the manner described above (FIG. 4B).

(3) Forming the Upper Electrode (FIG. 4C)

Next, a film of Al was formed on the organic compound layer 22 by vacuum vapor deposition or sputtering to a thickness of 5 nm to form a translucent layer. A film of indium zinc oxide was formed on the translucent layer by sputtering to a thickness of 200 nm to form a transparent electrode layer. A multi-layer electrode in which the translucent layer and the transparent electrode layer are layered in this order functions as the upper electrode 23 (FIG. 4C).

(4) Processing (patterning) of the Organic Compound Layer and the Upper Electrode (FIGS. 4D to 4G)

Next, a positive-type photoresist (for example, a product of AZ Electronic Materials named "AZ1500") was applied onto the upper electrode 23 to form a resist film. A solvent contained in the resist film was then volatilized to form the resist layer 50 (FIG. 4D). The thickness of the resist layer 50 at this point was 1,000 nm.

Next, the substrate 10 on which the resist layer 50 and the underlying layers had been formed was set in an exposing device and exposed to the exposure light 52 through a photomask 51 for 40 seconds to obtain the exposed resist layer 50a (FIG. 4E). After the exposure, the exposed resist layer 50a was developed for 1 minute with the use of a developer (for example, a solution that is created by diluting with water a product of AG Electronic Materials named "312MIF" to obtain a concentration of 50%). The exposed resist layer 50a was thus removed. Next, the patterned resist layer 50 was used as a mask for partial dry etching to remove portions of the upper electrode 23 and the organic compound layer 22 that were not covered with the resist layer 50 (FIG. 4F). The indium zinc oxide layer (transparent electrode layer) was etched in this step by 20 minutes of plasma etching with the use of CH4 and H2. The translucent layer was etched by 10 seconds of plasma etching with the use of $BCl_3$ and $Cl_2$. The organic compound layer 22 was etched by 10 minutes of plasma etching with the use of $O_2$.

The organic compound layer 22 and the upper electrode 23 were thus patterned into substantially the same layout in other regions than a region between the upper-electrode electrode pad portion 24 and the emission region 20 (FIG. 4G).

(5) Sealing Step (FIG. 4H)

Next, a thin film of silicon nitride (SiN) was used to seal an organic light emitting element that forms the organic light emitting device. Specifically, a silicon nitride film to serve as the sealing layer 30 was formed to a thickness of 2 μm through CVD by using $SiH_4$ and $N_2$ as a reactive gas, on the substrate 10 where the second upper electrode layer 24 patterned into a given shape and the underlying layers had been formed. The silicon nitride film was then patterned by photolithography to expose the external connection pad electrode (not shown). At this point, ends of the organic compound layer 22 and the upper electrode 23 that had been processed in the step (4) described above were covered entirely with the sealing layer 30 made of silicon nitride (FIG. 4H).

The organic light emitting device 1 of FIGS. 1A and 1B was manufactured through the steps described above.

Example 2

The organic light emitting device 1 of FIGS. 1A and 1B was manufactured by following the manufacturing process of FIGS. 5A to 5E. The organic light emitting device manufactured in Example 2 has an emission layer that is a blue emission layer, but the present invention is not limited thereto. In the organic light emitting device manufactured in Example 2, a plurality of light emitting pixels are arranged.

The present invention is also not limited to a particular arrangement of the light emitting pixels.

(1) Substrate Forming Step (FIG. 5A)

A substrate with electrodes (the substrate 10) was manufactured by the same method that was used in Example 1 (FIG. 5A).

(2) Forming and Processing (Patterning) of the Lift-Off Layer (FIG. 5B)

Next, a polyvinyl pyrrolidone (PVP) as a water-soluble polymer material was mixed with water to prepare an aqueous PVP solution. The prepared aqueous PVP solution was applied onto the substrate 10 by spin coating to form a PVP film. The formed PVP film was baked at 110° C. and dried to form the lift-off layer 53 having a thickness of 500 nm. A commercially available photoresist material (a product of AZ Electronic Materials named "AZ1500") was applied onto the lift-off layer 53 by spin coating to form a resist film. A solvent contained in the resist film was then volatilized to form the resist layer. The thickness of the resist layer at this point was 1,000 nm.

Next, the substrate 10 on which the resist layer and the underlying layers had been formed was set in an exposing device and exposed to the exposure light through a photomask having an opening in a region where the upper electrode 23 was to be formed for 40 seconds to obtain the exposed photoresist. After the exposure, the exposed photoresist was developed for 1 minute with the use of a developer (a solution that is created by diluting with water a product of AG Electronic Materials named "312MIF" to obtain a concentration of 50%) (FIG. 5D). The exposed photoresist was thus removed. Next, the resist layer patterned into a given shape was used as a mask for dry etching to remove a portion of the lift-off layer 53 that was not covered with the resist layer. In the dry etching, an etching gas (reactive gas) was oxygen, the flow rate of the etching gas was set to 20 sccm, the pressure in the device was set to 8 Pa, the power was set to 150 W, and the treatment time was set to 10 minutes. The dry etching removed the resist layer as well (FIG. 5B).

(3) Forming the Organic Compound Layer (FIG. 5C)

Next, the organic compound layer 22 was formed on the exposed lower electrode 21 (FIG. 5C). The organic compound layer 22 in Example 2 was given the same layer structure as the one in Example 1 by forming the respective layers of the organic compound layer 22 by the methods that were used in the step (2) of Example 1.

(4) Forming the Upper Electrode Layer (FIG. 5C)

Next, the upper electrode layer 23 was formed on the organic compound layer 22 (FIG. 5C). The upper electrode layer 23 in Example 2 was given the same layer structure as the one in Example 1 by forming the respective layers of the upper electrode layer 23 by the methods that were used in the step (3) of Example 1.

(5) Lift-Off Step (FIG. 5D)

Next, the surface of the substrate 10 was washed with pure water to remove the lift-off layer 53 and others. The lift-off was conducted with the use of a two-fluid nozzle for discharging a nitrogen gas (30 L/min.) and pure water (1 L/min.). Through this step, portions of the organic compound layer 22 and the first upper electrode layer 23 that were above the lift-off layer 53 were selectively removed along with the lift-off layer 53. The organic compound layer 22 was thus patterned so as to surround the light emitting pixel, and the value of tan(θ) of an end of the film forming the organic compound layer 22 was 0.8. This step also exposed the surface of the upper-electrode electrode pad portion 24. The substrate 10 was subsequently baked at 100° C. in vacuum to be dried.

(6) Sealing Step

The sealing layer 30 having a given shape was formed on the upper electrode 23 by the same method that was used in the step (6) of Example 1. The organic light emitting device 1 of FIGS. 1A and 1B was obtained in the manner described above.

Example 3

The organic light emitting device 1 was manufactured by the same method that was used in Example 1, except that, instead of forming the pixel isolating film 12 in the step (1) of Example 1, the lower electrode 21 was formed and patterned by photolithography in each pixel. The lower electrode 21 in Example 3 plays the role of an emission region defining unit.

Example 4

When forming the organic compound layer 22, the thickness of the electron transport layer was set to 55 nm, and a film having a thickness of 4 nm was formed as the electron injection layer by co-evaporation of silver and cesium carbonate, with the concentration of cesium carbonate in silver set to 10 wt %. When forming the upper electrode 23, a silver film was formed to a thickness of 16 nm and an indium zinc oxide film was further formed by sputtering to a thickness of 300 nm to form a multi-layer electrode film. The Ag film forming a part of the multi-layer electrode film was etched for 10 seconds by dry etching in which nitrogen dioxide ($NO_2$) and ammonia ($NH_3$) were used as etching gas, and the etching rate was set to 82 nm/min. An organic light emitting device was manufactured by the same method that was used in Example 1 except those points.

Example 5

In Example 5, a transparent substrate such as a glass substrate or a resin substrate was used instead of the silicon semiconductor substrate in Example 1. In Example 5, polycrystalline Si, amorphous Si, or an oxide semiconductor (for example, IGZO) was also used in a layer for forming a transistor. The lower electrode 21 was formed from a transparent conductive film consisting solely of an ITO layer. The upper electrode 23 was formed from a reflective electrode film made of Al. Specifically, an Al film was formed to a thickness of 300 nm by vacuum vapor deposition. Conditions of dry etching of the reflective electrode film, which was conducted to form the upper electrode 23, include using boron chloride ($BCl_3$) and chlorine ($Cl_2$) as an etching gas, setting the etching rate to 10 nm/sec., and setting the etching time to 30 seconds. The organic light emitting device was manufactured by the same method that was used in Example 1 except those points.

Example 6

The organic light emitting device 1 was manufactured by the same method that was used in Example 1, except that the substrate with electrodes (the substrate 10) was formed so that the light emitting pixels 20 were arranged on the substrate 10 in a two-dimensional matrix (FIG. 2C).

Example 7

The substrate with electrodes (the substrate 10) of Example 7 was formed so that the light emitting pixels 20 each included a first sub-pixel 20a, a second sub-pixel 20b, and a third sub-pixel 20c and were arranged in a two-dimensional matrix (FIG. 2D). An organic compound layer for forming the sub-pixel 20a, an organic compound layer for forming the sub-pixel 20b, and an organic compound layer for forming the sub-pixel 20c were formed by vacuum vapor deposition with the use of a mask, while varying the thicknesses of the layers forming each organic compound layer and varying the material of the emission layer from one sub-pixel to another. An organic light emitting device was manufactured by the same method that was used in Example 1 except those points. In Example 7, the first sub-pixel 20a functions as a blue sub-pixel, the second sub-pixel 20b functions as a green sub-pixel, and the third sub-pixel 20c functions as a red sub-pixel.

Comparative Example 1

The organic light emitting device 1 was manufactured by the same method that was used in Example 1 except that the upper electrode 23 of Comparative Example 1 was formed into a given shape by sputtering with the use of a mask.

(Evaluation Results)

An organic light emitting device of the type that takes out light from the upper electrode side was obtained in each of Examples 1 to 4, 6, and 7. An organic light emitting device of the type that takes out light from the lower electrode side was obtained in Example 5. The organic light emitting device obtained in Example 7 is a full color display that includes pixels each emitting light of one of three colors (R, G, and B). In each Example, $\tan(\theta)$ was 0.9 that is an index for the shape in section of an end portion of a film to be turned into the organic compound layer 22, which forms the manufactured organic light emitting device 1, in other regions than a region between the upper-electrode electrode pad portion 24 and the emission region 20. The index $\tan(\theta)$ was 0.9 also for the shape in section of an end portion of a film to be turned into the upper electrode 23 in other regions than the region between the upper-electrode electrode pad portion 24 and the emission region 20. In short, the former $\tan(\theta)$ and the latter $\tan(\theta)$ were both equal to or more than 0.20. The film end taper width of the film end portion of the organic compound layer 22 was 0.7 µm in other regions than the region between the upper-electrode electrode pad portion 24 and the emission region 20. The film end taper width of the film end portion of the upper electrode 23 was also 0.7 µm in other regions than the region between the upper-electrode electrode pad portion 24 and the emission region 20.

The value of $\tan(\theta_3)$, which is an index for the shape in section of a film end portion of the organic compound layer 22 in the region between the upper-electrode electrode pad portion 24 and the emission region 20, was 0.036. This showed that the film end shape had a small gradient less than 0.2 and, with the film end shape having a gradient less than 0.2, the chance of disconnection of the upper electrode 23 was able to be reduced in the region between the upper-electrode electrode pad portion 24 and the emission region 20. The film end taper width of the organic compound layer in this region was measured to be 5.5 µm.

In each of the organic light emitting devices manufactured in Examples 1 to 7, the film end taper width that affects the frame region was 1.4 µm even with the taper width of the organic compound layer 22 and the taper width of the upper electrode 23 combined. In the organic light emitting device of Comparative Example 1, on the other hand, the film end taper width in the organic compound layer 22 was 5.5 µm and the film end taper width in the upper electrode 23 was 250 µm, 255. 5 µm in total. The film end taper width in the upper electrode 23 was large because, in sputtering where the formed film tends to be dense, there is more chance of a material flowing over. The film end taper width was therefore larger in the organic light emitting device of Comparative Example 1 than in the organic light emitting devices of Examples by 254.1 µm per side.

In the organic light emitting device of each Example, a film end of the organic compound layer 22 was covered with the upper electrode 23 or with the sealing layer 30 to prevent the deterioration of the light emitting pixel, which is caused by the lateral permeation of moisture and oxygen. The resultant light emitting device therefore has a long life.

According to one embodiment of the present invention, the organic light emitting device in which electrical connection to the upper electrode is secured and the frame region is narrow may be formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-124482, filed Jun. 17, 2014, which is hereby incorporated by reference herein in its entirety.

What is claimed is:

1. An organic light emitting device, comprising:
a substrate;
a lower electrode disposed on the substrate;
an upper electrode; and
an organic compound layer comprising an emission layer, which is interposed between the lower electrode and the upper electrode,
wherein the organic compound layer covers the lower electrode,
wherein the upper electrode covers the organic compound layer,
wherein the substrate comprises an electrode pad portion, which is electrically connected to wiring connected to the upper electrode,
wherein a portion of the organic compound layer that is formed in a region between the lower electrode and the electrode pad portion has a film end, and, when an angle formed by a slant in section of the film end and a surface of the substrate is given as $\theta_1$, Formula (1) and Formula (2) are satisfied, and
wherein a portion of the organic compound layer that is formed in at least a part of other regions than the region between the lower electrode and the electrode pad portion has a film end, and, when an angle formed by a slant in section of the film end and the surface of the substrate is given as $\theta_3$, Formula (3) and Formula (4) are satisfied, $$\tan(\theta_1)=d_1/d_2 \tag{1}$$

$$\tan(\theta_1)<0.2 \tag{2}$$

$$\tan(\theta_3)=d_3/d_4 \tag{3}$$

$$\tan(\theta_3)\geq 0.2 \tag{4}$$

the symbols $d_1$ and $d_2$ in Formula (1) representing a thickness of the organic compound layer and a taper width in section of the film end of the organic compound layer, respectively, the symbols $d_3$ and $d_4$ in Formula (3) representing a thickness of the organic compound layer and a taper width in section of the film end of the organic compound layer, respectively.

2. The organic light emitting device according to claim 1, wherein, when a slant in section of a film end of the upper electrode forms an angle with the surface of the substrate and the angle is given as $\theta_2$, Formulas (5) and (6) are satisfied, $$\tan(\theta_2) = d_5/d_6 \tag{5}$$

$$\tan(\theta_2) \geq 0.2 \tag{6}$$

the symbols $d_5$ and $d_6$ in Formula (5) representing a thickness of the upper electrode and a taper width in section of the film end of the upper electrode, respectively.

3. The organic light emitting device according to claim 1, wherein a portion of the organic compound layer that is formed in all of other regions than the region between the lower electrode and the electrode pad portion has a film end, and, when an angle formed by a slant in section of the film end and the surface of the substrate is given as $\theta_3$, Formulas (3) and (4) are satisfied.

4. The organic light emitting device according to claim 1, further comprising a sealing layer for covering the upper electrode,
wherein the sealing layer is patterned so as to have an opening that leaves an external connection terminal portion, which is arranged on the substrate, uncovered.

5. The organic light emitting device according to claim 1, wherein each film end of the organic compound layer is covered with one of the upper electrode and the sealing layer.

6. The organic light emitting device according to claim 1, wherein one of the taper width in section of the film end of the organic compound layer and a taper width in section of a film end of the upper electrode is within 5 μm.

7. A display device, comprising:
the organic light emitting device of claim 1; and
an active element connected to the organic light emitting device.

8. An image information processing device, comprising:
an input portion configured to input image information;
an information processing portion configured to process the image information; and
a display portion configured to display an image,
wherein the display portion comprises the display device of claim 7.

9. A lighting device, comprising:
the organic light emitting device of claim 1; and
an AC/DC converter configured to supply a driving voltage to the organic light emitting device.

10. A lighting device, comprising:
the organic light emitting device of claim 1; and
a heat sink,
wherein the heat sink is configured to dissipate heat inside the lighting device to the outside.

11. An image forming device, comprising:
a photosensitive member;
a charging portion configured to charge the photosensitive member;
an exposure portion configured to expose the photosensitive member; and
a developing portion configured to supply a developer to the photosensitive member,
wherein the exposure portion comprises the organic light emitting device of claim 1.

12. An exposing device configured to expose a photosensitive member, comprising a plurality of organic light emitting devices, at least one of which is the organic light emitting device of claim 1,
wherein the plurality of organic light emitting devices are arranged in a single line along a long axis of the photosensitive member.

* * * * *